United States Patent [19]

Shiomura et al.

[11] Patent Number: 4,865,795
[45] Date of Patent: Sep. 12, 1989

[54] PROCESS FOR PRODUCING THERMOSETTING RESINS

[75] Inventors: Tetsunosuke Shiomura, Tokyo; Yoshiho Sonobe, Yokohama; Akihiro Yamaguchi, Kamakura, all of Japan

[73] Assignee: Mitsui Toatsu Chemicals, Incorporated, Tokyo, Japan

[21] Appl. No.: 206,040

[22] Filed: Jun. 13, 1988

[30] Foreign Application Priority Data

Jun. 19, 1987 [JP] Japan ................... 62-151480

[51] Int. Cl.$^4$ ............................................. C08G 18/00
[52] U.S. Cl. ........................... 264/299; 264/328.2; 264/328.6; 428/224; 428/228; 428/290; 528/44; 528/51; 528/52; 528/53; 528/57
[58] Field of Search ............ 528/57, 44, 51, 53, 528/52; 264/328.2, 328.6, 299; 428/224, 228, 290

[56] References Cited

U.S. PATENT DOCUMENTS

| | | | |
|---|---|---|---|
| 3,020,262 | 2/1962 | Speranza | 528/52 |
| 3,187,065 | 6/1965 | McPherson et al. | 528/57 |
| 3,766,147 | 10/1973 | Wolgemuth | 528/371 |
| 3,878,156 | 4/1975 | Olstowski et al. | 524/732 |
| 4,080,345 | 3/1978 | Reimhofer | 260/2.5 AC |
| 4,359,507 | 11/1982 | Gaul et al. | 428/425.1 |
| 4,414,316 | 11/1983 | Conley | 430/496 |
| 4,575,518 | 3/1986 | Rasshofer et al. | 521/51 |
| 4,736,008 | 4/1988 | Kouno et al. | 528/57 |

OTHER PUBLICATIONS

Tsuzaki et al., J. Org. Chem. 25, (1/1960), 1009–1012.
Chemical Abstracts, 100 105388u (7–80).

Primary Examiner—Maurice J. Welsh
Assistant Examiner—L. Henderson
Attorney, Agent, or Firm—Fisher, Christen & Sabol

[57] ABSTRACT

In a process for producing thermosetting resins by the polymerization reaction of a cyclic carbonate with a polyvalent isocyanate compound, potassium fluoride is used as the catalyst. If desired, a co-catalyst selected from the group consisting of polyethylene oxides, cryptands and quaternary onium salts is additionally used. The thermosetting resins so produced have excellent impact stength and, therefore, are useful as molded materials and various substrates.

24 Claims, No Drawings

PROCESS FOR PRODUCING THERMOSETTING RESINS

BACKGROUND OF THE INVENTION

1. Field of the Invention

The invention relates to a process for producing thermosetting resins of the rapid hardening type by using a novel catalyst.

2. Description of The Prior Art

It has been reported by Tsuzaki, Ichikawa and Kase that a cyclic carbonate reacts with an isocyanate compound in the presence of a tertiary amine to form a molecular complex with trimerization of the isocyanate groups (i.e., formation of an isocyanurate ring) and, when heated, to form an oxazolidone ring with evolution of carbon dioxide, and that a resin is formed when the isocyanate compound is a polyvalent compound [J. Org. Chem., 25, 1009 (1960)]. It has also been reported by Gaul and Nguyen that a mixture of a polyvalent isocyanate and a cyclic carbonate is heated to form a thermosetting resin useful as an adhesive (Belgian Pat. No. 891,879; U.S. Pat. No. 4,359,507; CA No. 100, 105, 388).

However, the prior art processes using a tertiary amine as the catalyst are disadvantageous in that the resulting polymer tends to assume a reddish brown color and produce a significant amount of gas bubbles. Moreover, when the reaction is carried out a large scale, the amine gives off an irritant odor. Thus, there is a large demand for nonvolatile catalysts.

BROAD DESCRIPTION OF THE INVENTION

The present invention involves the discovery that the above-described problems can be solved by using potassium fluoride as the catalyst in place of tertiary amines. The present invention has been completed on the basis of this finding. According to the present invention, there is provided a process for producing thermosetting resins by the polymerization reaction of a cyclic carbonate with a polyvalent isocyanate compound, the process being characterized in that potassium fluoride is used as the catalyst.

DETAILED DESCRIPTION OF THE INVENTION

The process of the present invention makes it possible to complete the hardening reaction within several minutes without producing any appreciable amount of gas bubbles and to, thereby, form a thermosetting resin having relatively high transparency and excellent impact strength.

The potassium fluoride used as the catalyst in the process of the present invention can be, for example, in a particulate form, such as, of powder, flakes or pellets. Alternatively, the catalyst can be supported on an inert carrier, such as, active carbon or diatomaceous earth.

Although the potassium fluoride can be used alone, its catalytic activity can be enhanced by using, in combination therewith, a co-catalyst selected from the group consisting of polyethylene oxides, cryptands and quaternary onium salts. In particular, the catalytic activity is markedly enhanced when polyethylene oxides or cryptands are used. Useful polyethylene oxides include ethylene glycol dimethyl ester, diethylene glycol dimethyl ether, polyethylene glycols (preferably having a molecular weight of 300 to 1000), 18-crown-6-ether, dibenzo-18-crown-6 and dicyclohexyl-18-crown-6 and the like. Useful cryptands include tris(dioxa-3,6-heptyl-)amine and the like. Cryptands are generally defined as complexes in which a bicyclic or larger neutral ligand of the crown ether type exists, enclosing a central ion in three dimensions.—See the article in the *J. Am. Chem. Soc.*, 97, 6700 (1975), by J. M. Lehn et al., also reprinted in the section entitled "Review", in the journal *Struct. Bonding*, 16, 1 (1973), by J. M. Lehn. This definition is also reprinted in the section entitled. "Noncyclic Cryptates" in the book/journal *Agnew Chem. Int. Ed. Engl.*, 16, (1977), No. 8, pp. 548–549, by Fritz Vogtle et al. Further for the purposes of the process described below, cryptands include neutral ligands for alkali metal ions which are not cyclic but demonstrate some cryptand properties in terms of the complete envelopment of the ion, as well as the strength and selectivity of its complexation, e.g., tris (dioxa-3,6-heptyl) amine. Useful quaternary onium salts include benzyltriethylammonium chloride, tetrabutylphosphonium chloride and the like.

Potassium fluoride is preferably used in an amount of 0.0001 to 0.05 part by weight, more preferably 0.001 to 0.05 part by weight, per part by weight of the polyvalent isocyanate compound described herein. The co-catalyst is preferably used in an amount of 1/100 to 100 times, more preferably 1/10 to 5 times, the weight of the potassium fluoride. Since the potassium fluoride loses its catalytic activity in the presence of water, it is important to carry out the reaction under water-free (anhydrous) conditions.

In the process of the present invention, the polymerization reaction of a cyclic carbonate with a polyvalent isocyanate compound is carried out in the presence of a catalyst system comprising the potassium fluoride and, optionally, the co-catalyst. Polyvalent isocyanate compounds useful for this reaction include 2,4- and 2,6-toluene diisocyanates, 4,4'-diphenylmethane diisocyanate, 4,4'-diphenyldimethylmethane diisocyanate, 1,4-phenylene diisocyanate, 4,4'-diphenyl ether diisocyanate, 1,4-tetramethylene diisocyanate, 1,6-hexamethylene diisocyanate, 1,4-cyclohexyl diisocyanate, 4,4'-hexahydrodiphenylmethane diisocyanate and the like.

Useful cyclic carbonates include ethylene carbonate, propylene carbonate, chloroethylene carbonate and the like.

The molar ratio of the cyclic carbonate to the polyvalent isocyanate compound preferably is between 10:1 and 1:10.

The reaction can be carried out in the presence of a solvent such as benzene, toluene, xylene, ethyl acetate, isopropyl acetate, butyl acetate, N-methylpyrrolidone, dimethylformamide and sulfolane. However, it is preferable to carry out the reaction in the absence of a solvent.

Although the reaction temperature can vary according to the type of the polyvalent isocyanate compound used, the amount of catalyst, and the like, it is preferable to carry out the reaction at a temperature between room temperature and 160° C.

The reaction is preferably carried out in the absence of air because the reaction rate becomes slower in the presence of air. The reaction time usually ranges from 1 minute to 5 hours.

Thus, the use of potassium fluoride as the catalyst makes it possible to obtain thermosetting resins producing essentially no gas bubbles and having high transparency and excellent impact strength. Moreover, when a co-catalyst selected from the group consisting of polyethylene oxides, cryptands and quaternary onium salts, is used in combination with the catalyst, the induction period of the reaction can be shortened to about 30 seconds and the hardening reaction can be completed within several minutes. Accordingly, the process of the present invention can be applied to reaction-injection molding (RIM). Furthermore, since the resultant resins have good adhesion to glass fibers and produce essentially no gas bubbles, useful molded materials can be obtained by composite molding with glass fabric bases. Furthermore, the resins produced by the process of the present invention have high rigidity and excellent impact strength. Therefore, using casting, compression molding, injection molding or other techniques, the resins can be formed into sheets which are useful as exterior automobile panels and printed-circuit board bases.

The present invention is further illustrated by the following examples. In all of the examples and comparative examples given below, the reaction was carried out in an atmosphere of nitrogen.

EXAMPLE 1

30 g (0.29 mole) of propylene carbonate was mixed with 70 g (0.28 mole) of 4,4'-diphenylmethane diisocyanate. After the addition of 0.2 g of powdered potassium fluoride, the resultant reaction mixture was heated to 80° C. It solidified in 20 minutes. The resultant product was a pale yellow, transparent solid containing no gas bubbles. The solid was removed by breaking the reaction vessel. The solid could not be easily broken with a hammer.

EXAMPLE 2

While 30 g of propylene carbonate, 70 g of 4,4'-diphenylmethane diisocyanate and 0.1 g of powdered potassium fluoride were being vigorously mixed at 50° C., 0.1 g of 18-crown-6-ether was added thereto. After 30 seconds, a violent exohtermic reactant started and the reaction mixture solidified perfectly in 3 minutes. The temperature reached a maximum value of 130° C. The resultant product was a pale yellow, transparency solid containing no gas bubbles. Thirty-five (35) seconds after the addition of 18-crown-6-ether, a part of the reaction mixture was removed and cast to form a number of specimens having a thickness of 1 mm. After solidification, the specimens were used to determine some properties of the resin. The resin had a tensile strength of 520 kg/cm$^2$, an elongation of 0.7 percent, a notched Izod impact strength of 2.0 kg.cm/cm, and a heat distortion temperature of 160° C.

COMPARATIVE EXAMPLE 1

The reaction was carried out in the same manner as described in Example 1, except that N-methylmorpholine was used as the catalyst in place of the potassium fluoride. The reaction mixture solidified in 10 minutes, but gas bubbles were heavily produced during the reaction. The resultant solid contained an abundance of gas bubbles and had a reddish brown color.

COMPARATIVE EXAMPLE 2

The reaction was carried out in the same manner as described in Example 1, except that lithium bromide was used as the catalyst in place of the potassium fluoride. However, the reaction mixture did not become viscous even after an hour at 50° C.

EXAMPLE 3

At 50° C., 2.8 g (0.032 mole) of ethylene carbonate was mixed with 16.7 g (0.096 mole) of 2,4-toluylene diisocyanate. Then, 0.05 g of potassium fluoride and 0.20 g of polyethylene glycol (having an average molecular weight of 600) were added thereto. After 10 minutes, the temperature rose to 110° C. and the reaction mixture solidified as a mass. The resultant product was a light pink, transparent solid containing no gas bubbles.

EXAMPLE 4

In a box which had been purged with nitrogen, 30 g (0.29 mole) of propylene carbonate, 70 g (0.28 mole) of 4,4'-diphenylmethane diisocyanate, 0.2 g of potassium fluoride, and 0.1 g of tris(dioxo-3,6-heptyl)amine (commercially available from Rhone-Poulenc Inc. under the trade name of TDA-1) were mixed well to prepare a reaction mixture. Then 20 g of glass mat (commercially available from Owens Corning Fiberglas Corp. under the trade name of M-8610) was impregnated with the reaction mixture. The impregnated glass mat evolved heat and became no longer viscous after 5 minutes to form a tough composite material.

What is claimed is:

1. In a process for producing thermosetting resins by the polymerization reaction of a cyclic carbonate with a polyvalent isocyanate compound, the process is characterized in that potassium fluoride is used as the catalyst.

2. The process as claimed in claim 1 wherein the potassium fluoride is supported on an inert carrier.

3. The process as claimed in claim 2 wherein the inert carrier is activated carbon or diatomaceous earth.

4. The process as claimed in claim 1 wherein the potassium fluoride is in the form of powder, flakes or pellets.

5. The process as claimed in claim 1 wherein the potassium fluoride is present in an amount of 0.0001 to 0.5 part by weight per part by weight of the polyvalent isocyanate compound.

6. The process as claimed in claim 1 wherein no tertiary amine is present and the reaction is conducted under water-free conditions.

7. The process as claimed in claim 1 wherein a co-catalyst selected from the group consisting of a polyethylene oxide, a cryptand and a quaternary onium salt, is used in combination with the potassium fluoride.

8. The process as claimed in claim 7 wherein the co-catalyst is present in an amount of 1/100 to 100 times the weight of the potassium fluoride.

9. The process as claimed in claim 7 wherein the polyethylene oxide is selected from the group consisting of ethylene glycol dimethyl ether, diethylene glycol dimethyl ether, a polyethylene glycol, dibenzo-18-crown-6 and dicyclohexyl-18-crown-6.

10. The process as claimed in claim 7 wherein the cryptand is tris(dioxa-3,6-heptyl)amine.

11. The process as claimed in claim 7 wherein the quaternary onium salt is benzyltriethylammonium chloride or tetrabutylphosphonium chloride.

12. The process as claimed in claim 1 wherein the molar ratio of the cyclic carbonate to the polyvalent isocyanate compound is from 10:1 to 1:10.

13. The process as claimed in claim 1 wherein the polyvalent isocyanate compound is selected from the group consisting of 2,4-toluene diisocyanate, 2,6-toluene diisocyanate, 4,4'-diphenylmethane diisocyanate, 4,4'-diphenyldimethylmethane diisocyanate, 1,4-phenylene diisocyanate, 4,4'-diphenyl ether diisocyanate, 1,4-tetramethylene diisocyanate, 1,6-hexamethylene diisocyanate, 1,4-cyclohexyl diisocyanate and 4,4'-hexahydrodiphenylmethane diisocyanate.

14. The process as claimed in claim 1 wherein the cyclic carbonate is ethylene carbonate, propylene carbonate or chloroethylene carbonate.

15. The process as claimed in claim 1 wherein the reaction is conducted in the absence of any solvent.

16. The process as claimed in claim 1 wherein the reaction is conducted in the presence of a solvent.

17. The process as claimed in claim 1 wherein the solvent is selected from the group consisting of benzene, toluene, xylene, ethyl acetate, isopropyl acetate, butyl acetate, N-methylpyrrolidone, dimethylformamide and sulfolane.

18. The process as claimed in claim 1 wherein the reaction is conducted at a temperature of room temperature to 160° C.

19. The thermosetting resin produced by the process of claim 1, said thermosetting resin not having any appreciable amount of gas bubbles therein, having excellent impact strength, having relatively high transparency and having high rigidity.

20. A composite material comprising a glass fabric base impregnated with the thermosetting resin produced by the process of claim 1.

21. A molded composite comprising a glass fabric base and the thermosetting resin produced by the process of claim 1.

22. A sheet of the thermosetting resin produced by the process of claim 1, which has been prepared by casting or compression molding.

23. The process as claimed in claim 1 wherein the process is conducted using reaction-injection molding.

24. In a catlytic process for producing thermosetting resins by the polymerization reaction of a cyclic carbonate with a polyvalent isocyanate compound, the process is characterized in that the catalyst system is selected from the group consisting of (a) potassium fluoride and (b) a co-catalyst selected from the group consisting of a polyethylene oxide, a cryptand and a quaternary onium salt, in combination with potassium fluoride, (c) potassium fluoride on an inert carrier, and (d) potassium fluoride on an inert carrier in combination with co-catalyst (b).

* * * * *